(12) United States Patent
Embleton et al.

(10) Patent No.: US 11,129,307 B2
(45) Date of Patent: Sep. 21, 2021

(54) SYSTEM AND METHOD FOR MANAGING THERMAL STATES OF DEVICES

(71) Applicant: Dell Products L.P., Hopkinton, MA (US)

(72) Inventors: Steven Embleton, Round Rock, TX (US); Ben John Sy, Austin, TX (US); Eric Michael Tunks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/516,556

(22) Filed: Jul. 19, 2019

(65) Prior Publication Data

US 2021/0022271 A1 Jan. 21, 2021

(51) Int. Cl.
*H05K 7/20* (2006.01)

(52) U.S. Cl.
CPC ......... *H05K 7/20836* (2013.01); *H05K 7/207* (2013.01); *H05K 7/20727* (2013.01); *H05K 7/20709* (2013.01); *H05K 7/20781* (2013.01)

(58) Field of Classification Search
CPC .. H05K 7/1488; H05K 7/20209; H05K 7/207; H05K 7/20709; H05K 7/20781; H05K 7/20836; H05K 9/0062; H05K 7/20727; H04W 76/10
See application file for complete search history.

(56) References Cited

U.S. PATENT DOCUMENTS

| | | |
|---|---|---|
| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles et al. |
| 5,084,802 A | 1/1992 | Nguyenngoc |
| 5,250,752 A | 10/1993 | Cutright |
| 5,294,748 A | 3/1994 | Schwenk et al. |
| 5,323,298 A | 6/1994 | Shatas et al. |
| 5,437,560 A | 8/1995 | Mizuguchi |
| 5,545,844 A | 8/1996 | Plummer, III et al. |
| 5,545,845 A | 8/1996 | Flores |
| 5,649,831 A | 7/1997 | Townsend |
| 5,762,513 A | 6/1998 | Stine |
| 5,812,370 A | 9/1998 | Moore et al. |
| 5,943,218 A | 8/1999 | Liu |
| 6,011,221 A | 1/2000 | Lecinski et al. |
| 6,038,130 A | 3/2000 | Boeck et al. |
| 6,045,385 A | 4/2000 | Kane |

(Continued)

OTHER PUBLICATIONS

"Full HD Endoscopes"; joimax® GmbH, May 1, 2019; https://web.archive.org/web/20190501003355/https://www.joimax.com/en/products/electronic-devices/hd_endoscopes/.

(Continued)

*Primary Examiner* — Jacob R Crum
(74) *Attorney, Agent, or Firm* — Chamberlain, Hrdlicka, White, Williams & Aughtry

(57) ABSTRACT

A data processing device includes an internal volume for housing devices. The devices may be, for example, electromagnetic interference emitting devices such as cellular telephones. The data processing devices also includes a suppressor adapted to provide thermal management services to a device of the devices. Providing thermal management services to the device may include isolating the device from the devices in response to the device entering a thermally compromised state.

11 Claims, 15 Drawing Sheets

(56) References Cited

U.S. PATENT DOCUMENTS

| | | | |
|---|---|---|---|
| 6,068,009 A | 5/2000 | Paes et al. | |
| 6,176,727 B1 | 1/2001 | Liu et al. | |
| 6,208,514 B1 | 3/2001 | Stark et al. | |
| 6,225,554 B1 | 5/2001 | Trehan et al. | |
| 6,242,690 B1 * | 6/2001 | Glover | H05K 9/0037 |
| | | | 174/367 |
| 6,269,001 B1 | 7/2001 | Matteson et al. | |
| 6,331,940 B1 | 12/2001 | Lin | |
| 6,332,792 B1 | 12/2001 | Lin et al. | |
| 6,370,036 B1 | 4/2002 | Boe | |
| 6,377,451 B1 | 4/2002 | Furuya | |
| 6,437,987 B1 | 8/2002 | Lin | |
| 6,517,369 B1 | 2/2003 | Butterbaugh et al. | |
| 6,613,977 B1 | 9/2003 | Fowler | |
| 6,657,214 B1 | 12/2003 | Foegelle et al. | |
| 6,695,630 B1 | 2/2004 | Ku | |
| 6,870,092 B2 | 3/2005 | Lambert et al. | |
| 6,947,290 B2 | 9/2005 | Hirata | |
| 7,035,087 B2 | 4/2006 | Tan | |
| 7,075,796 B1 | 7/2006 | Pritchett | |
| 7,133,296 B2 | 11/2006 | Choi et al. | |
| 7,287,996 B1 | 10/2007 | Shing | |
| 7,371,097 B1 | 5/2008 | Pennypacker et al. | |
| 7,371,977 B1 | 5/2008 | Preonas | |
| 7,692,934 B2 | 4/2010 | Bartscher et al. | |
| 7,695,313 B2 | 4/2010 | Karim et al. | |
| 7,757,847 B2 | 7/2010 | Tang et al. | |
| 8,059,414 B2 | 11/2011 | Wei | |
| 8,098,492 B2 | 1/2012 | Rosenberg et al. | |
| 8,310,834 B2 | 11/2012 | Fürholzer | |
| 8,508,956 B2 | 8/2013 | Nicol | |
| 8,530,756 B1 | 9/2013 | Winch | |
| 8,636,526 B2 | 1/2014 | Funamura et al. | |
| 8,642,900 B2 | 2/2014 | Nordling et al. | |
| 8,662,295 B2 | 3/2014 | Kubota et al. | |
| 8,687,374 B2 | 4/2014 | Watanabe et al. | |
| 8,720,682 B2 | 5/2014 | Navon et al. | |
| 8,760,859 B2 | 6/2014 | Fuchs et al. | |
| 8,969,738 B2 | 3/2015 | Ross | |
| 9,019,711 B2 | 4/2015 | Tamura | |
| 9,095,045 B2 | 7/2015 | Rojo et al. | |
| 9,370,132 B2 | 6/2016 | Coppola | |
| 9,497,894 B1 | 11/2016 | Ramsey | |
| 9,549,480 B1 | 1/2017 | Besterman | |
| 9,585,270 B2 | 2/2017 | Yang et al. | |
| 9,607,660 B2 | 3/2017 | Bennett, II et al. | |
| 9,640,910 B1 | 5/2017 | Chien et al. | |
| 9,642,290 B2 | 5/2017 | Anderson et al. | |
| 9,820,404 B1 | 11/2017 | Wu et al. | |
| 9,829,939 B1 | 11/2017 | Lien et al. | |
| 9,930,816 B2 | 3/2018 | Winch et al. | |
| 10,007,309 B1 | 6/2018 | Imwalle | |
| 10,249,984 B1 | 4/2019 | Rask | |
| 10,364,031 B2 | 7/2019 | Goupil | |
| 10,420,258 B1 | 9/2019 | Rahilly et al. | |
| 10,477,740 B2 | 11/2019 | Coppola | |
| 10,477,741 B1 | 11/2019 | Bae et al. | |
| 10,492,324 B2 | 11/2019 | Miura | |
| 10,520,532 B2 | 12/2019 | Lee | |
| 10,541,519 B2 | 1/2020 | Wavering | |
| 10,542,642 B2 | 1/2020 | Babhadiashar et al. | |
| 10,575,443 B2 | 2/2020 | Woodbury, II et al. | |
| 10,638,634 B1 | 4/2020 | Elsasser | |
| 10,707,636 B2 | 7/2020 | Yamamoto | |
| 10,720,722 B2 | 7/2020 | Tsorng et al. | |
| 10,734,763 B2 | 8/2020 | M R et al. | |
| 2002/0000645 A1 | 1/2002 | Sato et al. | |
| 2002/0001181 A1 | 1/2002 | Kondo | |
| 2002/0027769 A1 | 3/2002 | Kasahara et al. | |
| 2002/0064035 A1 | 5/2002 | Mair et al. | |
| 2003/0011988 A1 | 1/2003 | Irmer | |
| 2003/0057131 A1 | 3/2003 | Diaferia | |
| 2003/0137811 A1 | 7/2003 | Ling et al. | |
| 2003/0174474 A1 | 9/2003 | Mair et al. | |
| 2005/0247471 A1 | 11/2005 | Archambeault | |
| 2006/0025010 A1 | 2/2006 | Spitaels et al. | |
| 2007/0105445 A1 | 5/2007 | Manto et al. | |
| 2007/0145699 A1 | 6/2007 | Robbins | |
| 2007/0147013 A1 | 6/2007 | Robbins | |
| 2007/0151779 A1 | 7/2007 | Robbins | |
| 2008/0076291 A1 | 3/2008 | Ewing et al. | |
| 2009/0021925 A1 | 1/2009 | Heimann | |
| 2009/0095523 A1 | 4/2009 | Stevenson | |
| 2009/0146862 A1 | 6/2009 | Malone | |
| 2010/0117579 A1 | 5/2010 | Culbert | |
| 2010/0208433 A1 | 8/2010 | Heimann et al. | |
| 2010/0223878 A1 | 9/2010 | Lipka et al. | |
| 2010/0270299 A1 | 10/2010 | Baltussen | |
| 2010/0285636 A1 | 11/2010 | Chen | |
| 2010/0319981 A1 | 12/2010 | Kapusta et al. | |
| 2011/0011760 A1 | 1/2011 | Habersetzer | |
| 2011/0198245 A1 | 8/2011 | Soufan | |
| 2011/0222249 A1 | 9/2011 | Ruehl et al. | |
| 2011/0232956 A1 | 9/2011 | Ramsey | |
| 2012/0011700 A1 | 1/2012 | Kelaher et al. | |
| 2012/0044653 A1 | 2/2012 | Morris et al. | |
| 2012/0073873 A1 | 3/2012 | Nash | |
| 2012/0116590 A1 | 5/2012 | Florez-Iarrahondo | |
| 2012/0178364 A1 | 7/2012 | Dobyns | |
| 2012/0285738 A1 | 11/2012 | Cochrane et al. | |
| 2013/0160563 A1 | 6/2013 | Dingler et al. | |
| 2013/0194772 A1 | 8/2013 | Rojo et al. | |
| 2013/0206470 A1 | 8/2013 | Davis | |
| 2013/0258582 A1 | 10/2013 | Shelnutt | |
| 2013/0277520 A1 | 10/2013 | Funk et al. | |
| 2014/0138388 A1 * | 5/2014 | Synnestvedt | B62D 29/002 |
| | | | 220/563 |
| 2014/0368821 A1 * | 12/2014 | Gazaway | G01N 21/71 |
| | | | 356/402 |
| 2015/0014912 A1 | 1/2015 | Ivey et al. | |
| 2015/0245529 A1 | 8/2015 | Tam et al. | |
| 2015/0257310 A1 | 9/2015 | Desouza | |
| 2015/0271959 A1 | 9/2015 | Chen et al. | |
| 2015/0368423 A1 * | 12/2015 | Yamauchi | C08J 9/16 |
| | | | 521/56 |
| 2015/0373869 A1 * | 12/2015 | Macerini | H05K 7/2089 |
| | | | 361/704 |
| 2016/0081231 A1 | 3/2016 | Berke | |
| 2016/0111814 A1 | 4/2016 | Hirano et al. | |
| 2016/0159480 A1 | 6/2016 | Barth | |
| 2016/0182130 A1 * | 6/2016 | Ahmed | H04B 5/02 |
| | | | 455/41.1 |
| 2016/0372948 A1 | 12/2016 | Kvols | |
| 2016/0381818 A1 | 12/2016 | Mills et al. | |
| 2017/0347496 A1 | 11/2017 | Smith | |
| 2018/0062287 A1 | 3/2018 | Shaw et al. | |
| 2018/0257334 A1 * | 9/2018 | Motoyanagi | C08J 9/32 |
| 2019/0050030 A1 | 2/2019 | Baum | |
| 2019/0056439 A1 | 2/2019 | Lee | |
| 2019/0159371 A1 | 5/2019 | Grinsteinner | |
| 2019/0230828 A1 | 7/2019 | Murch | |
| 2019/0304922 A1 | 10/2019 | Maruthamuthu et al. | |
| 2019/0320796 A1 | 10/2019 | Ding | |
| 2019/0353356 A1 * | 11/2019 | Fischer | F28D 20/023 |
| 2019/0379183 A1 | 12/2019 | Winsor | |
| 2020/0187394 A1 | 6/2020 | Murugesan | |
| 2020/0187578 A1 * | 6/2020 | Sadato | B32B 27/322 |

OTHER PUBLICATIONS

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

* cited by examiner

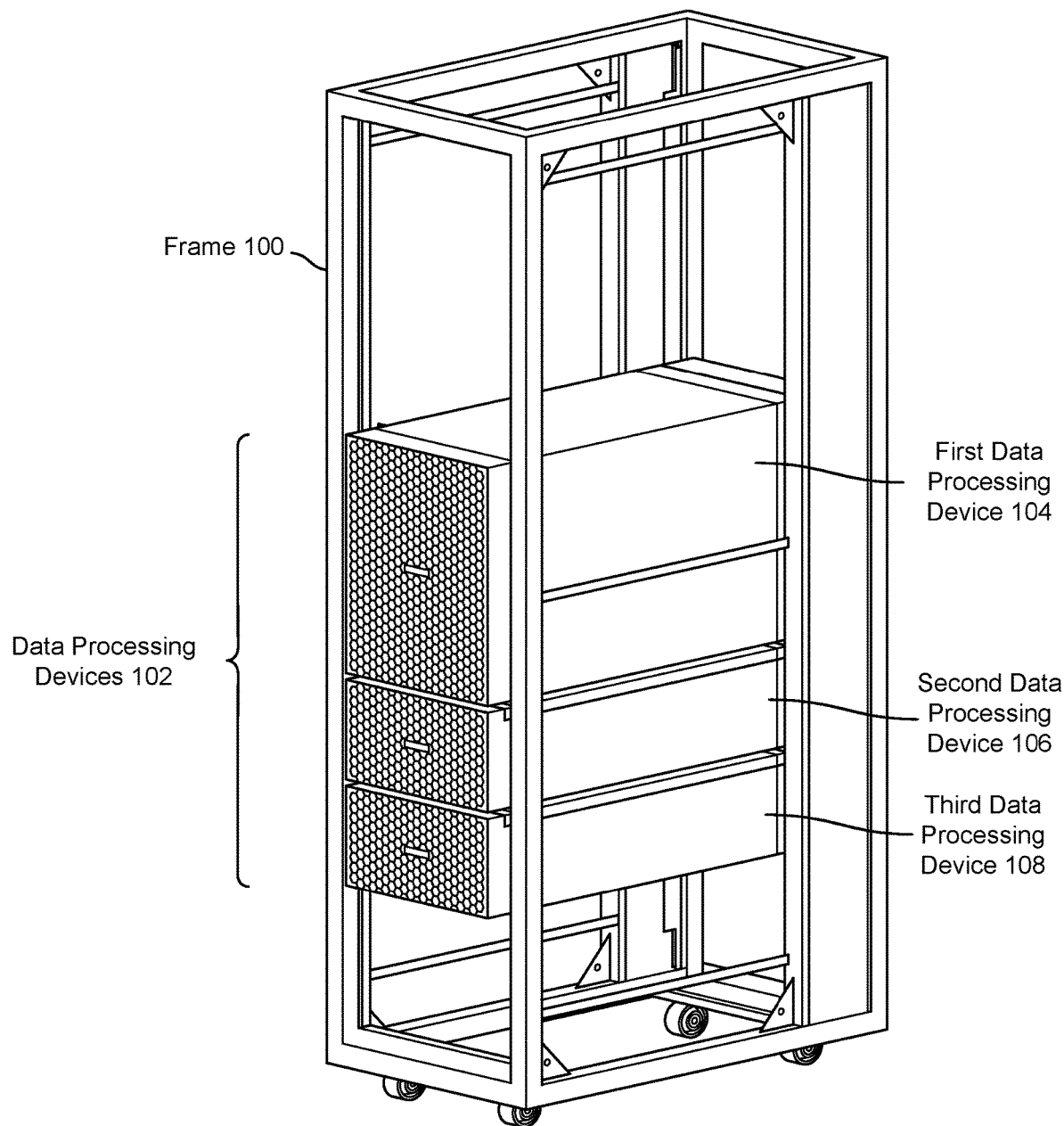
FIG. 1.1

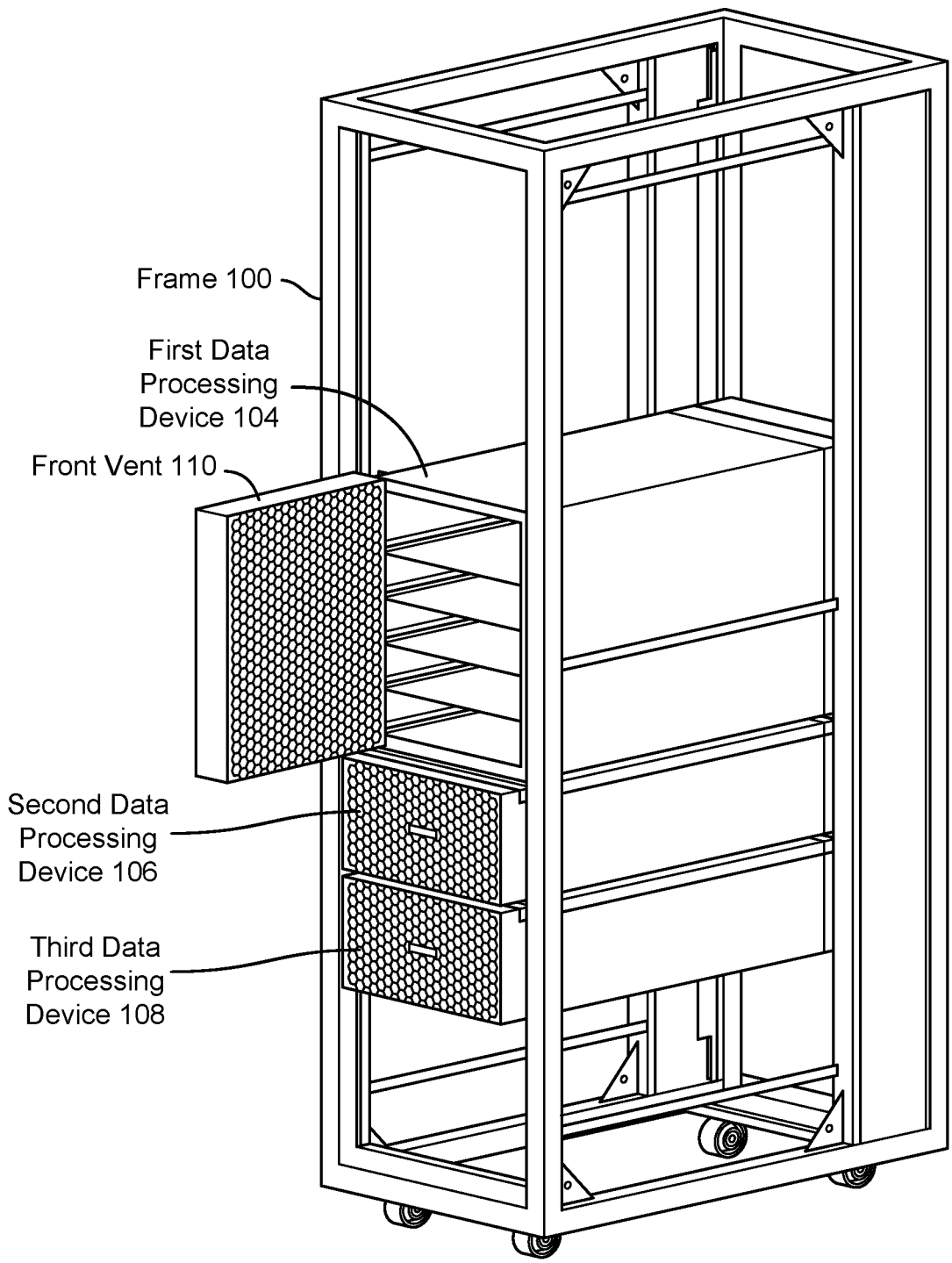
FIG. 1.2

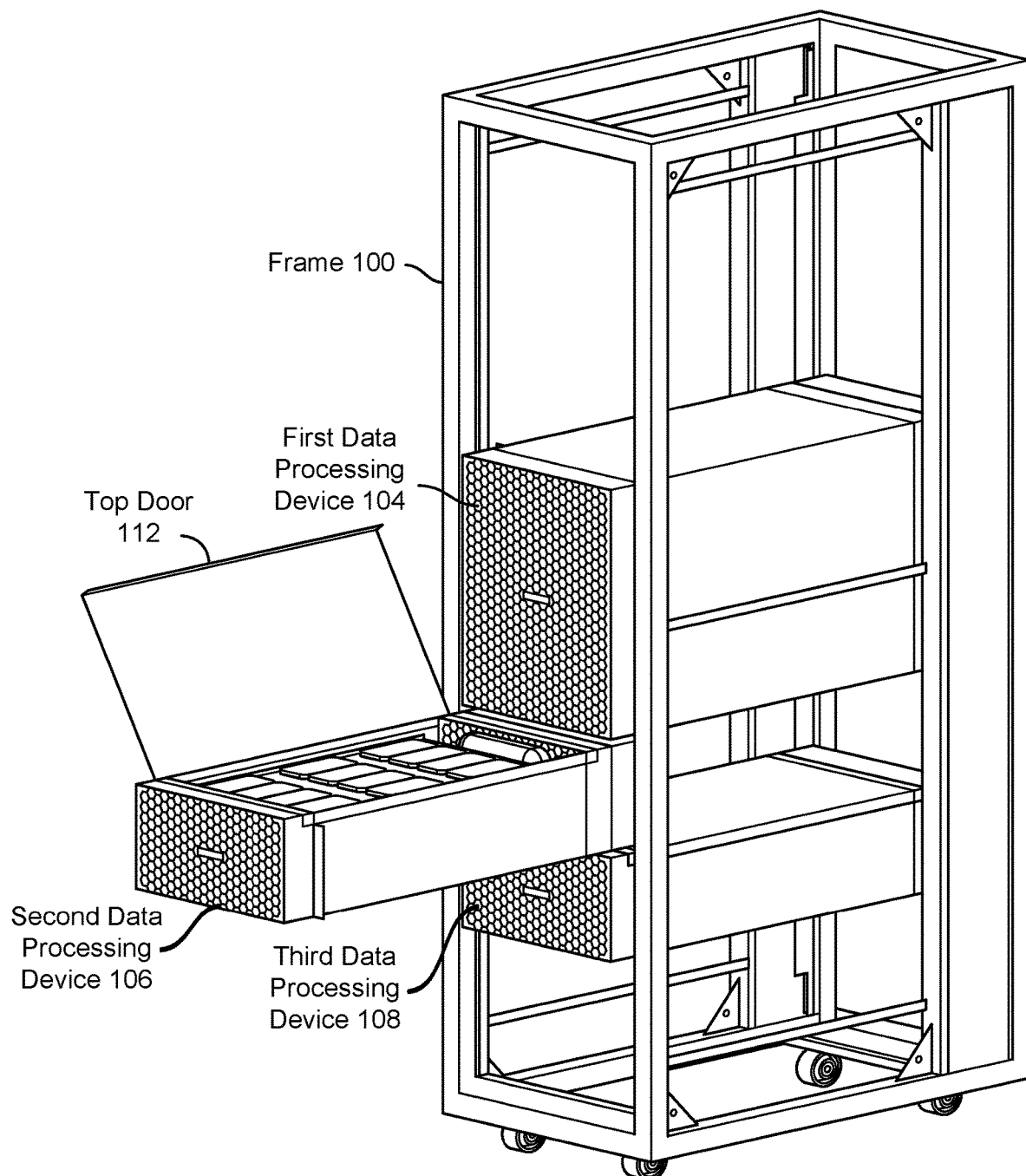
FIG. 1.3

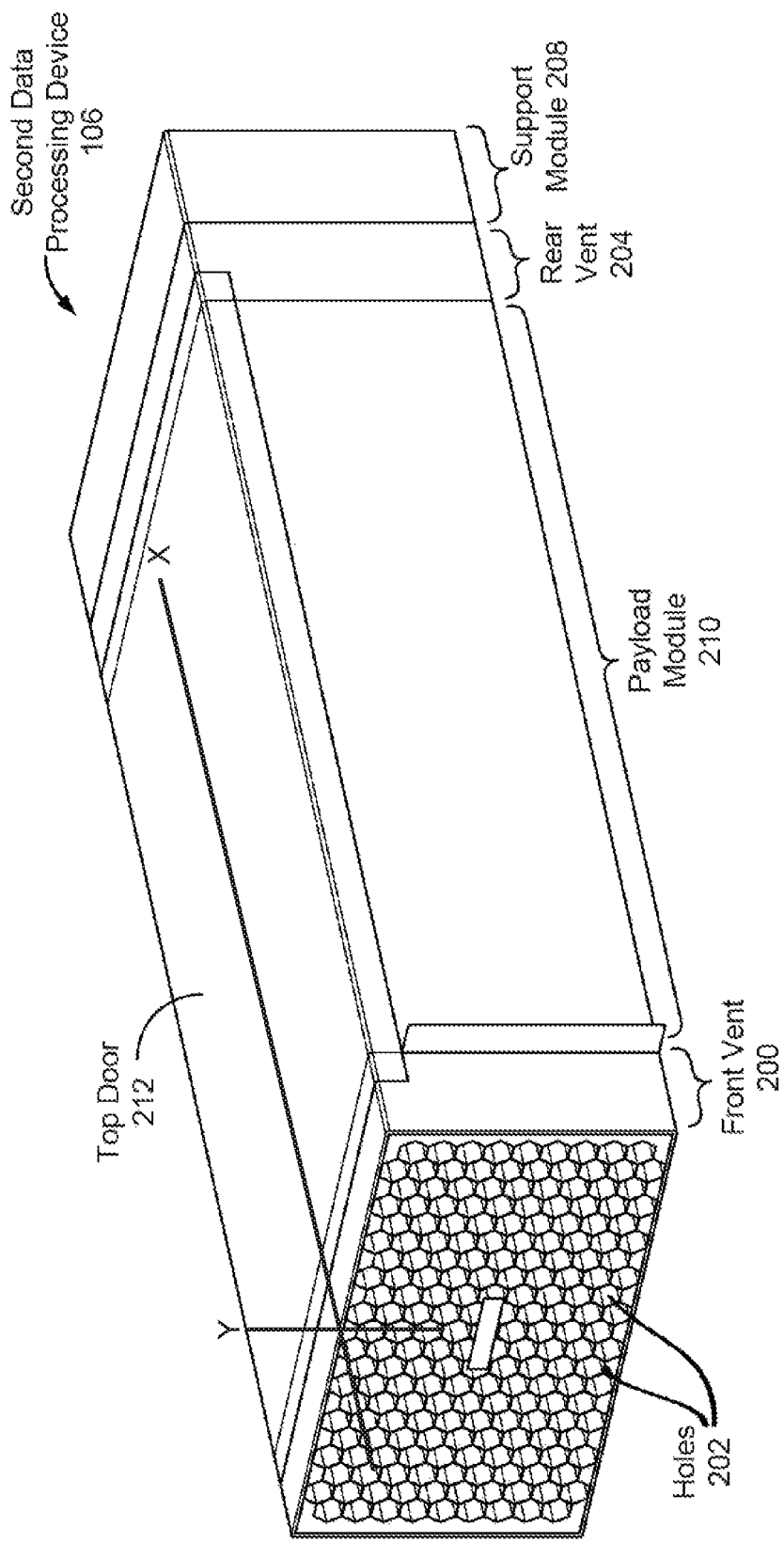
FIG. 2.1

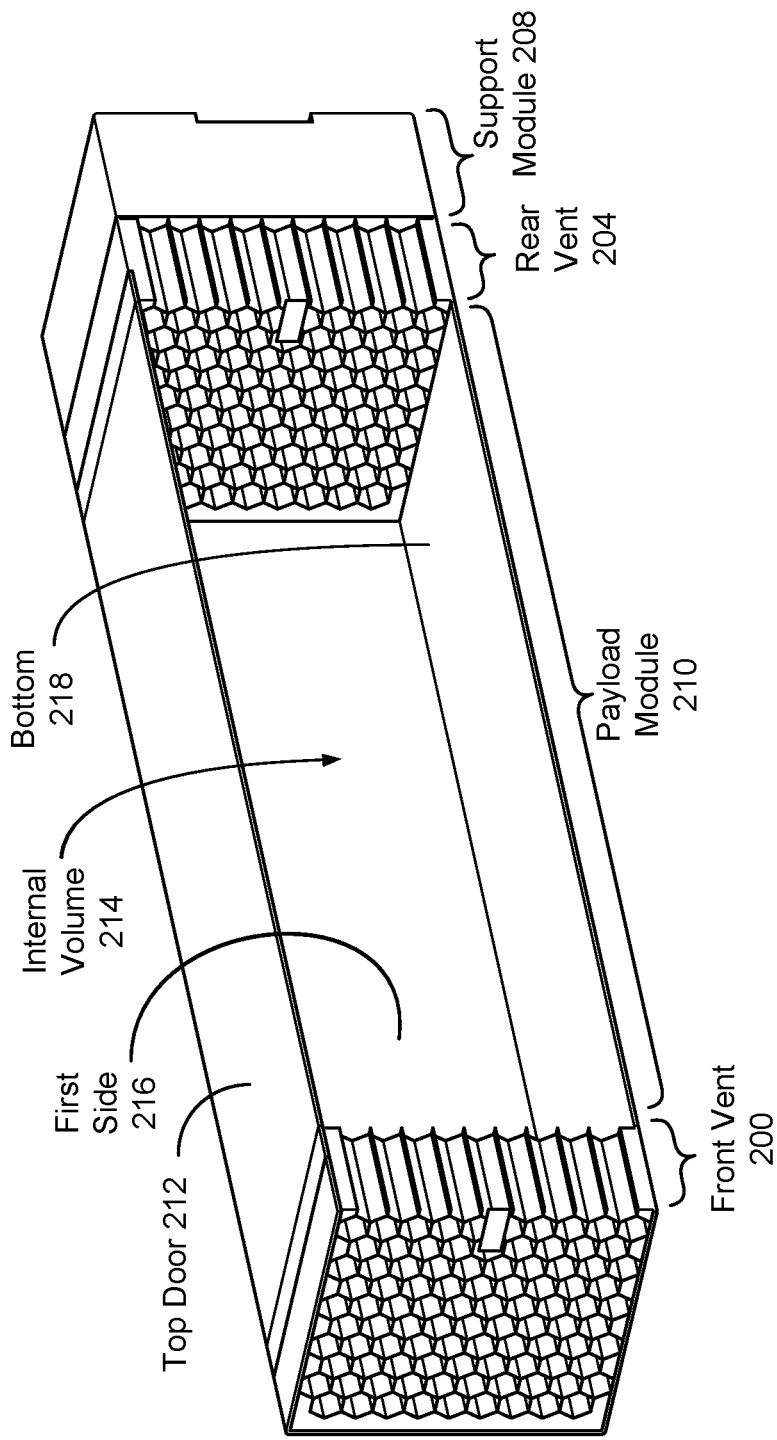
FIG. 2.2

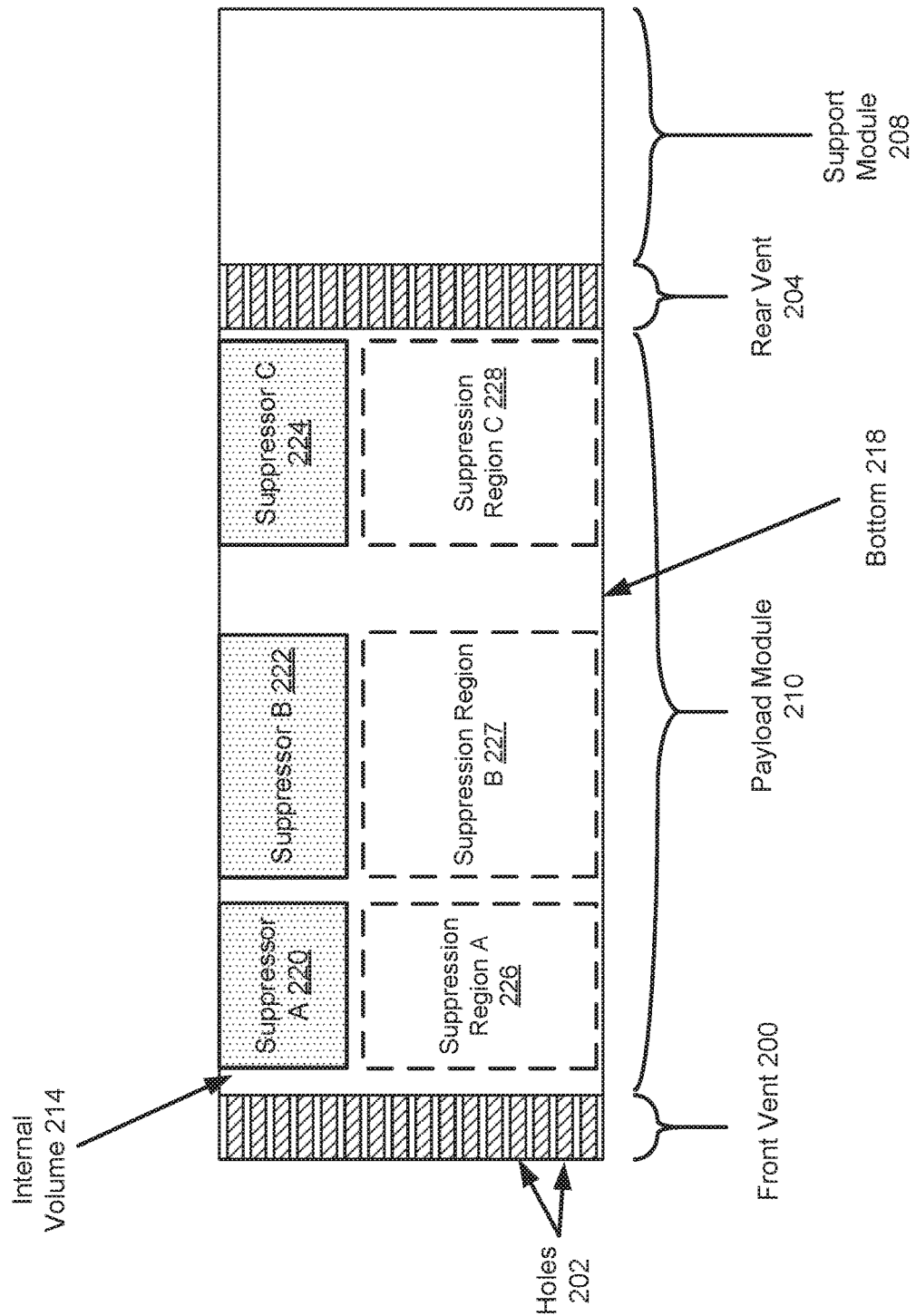
FIG. 2.3

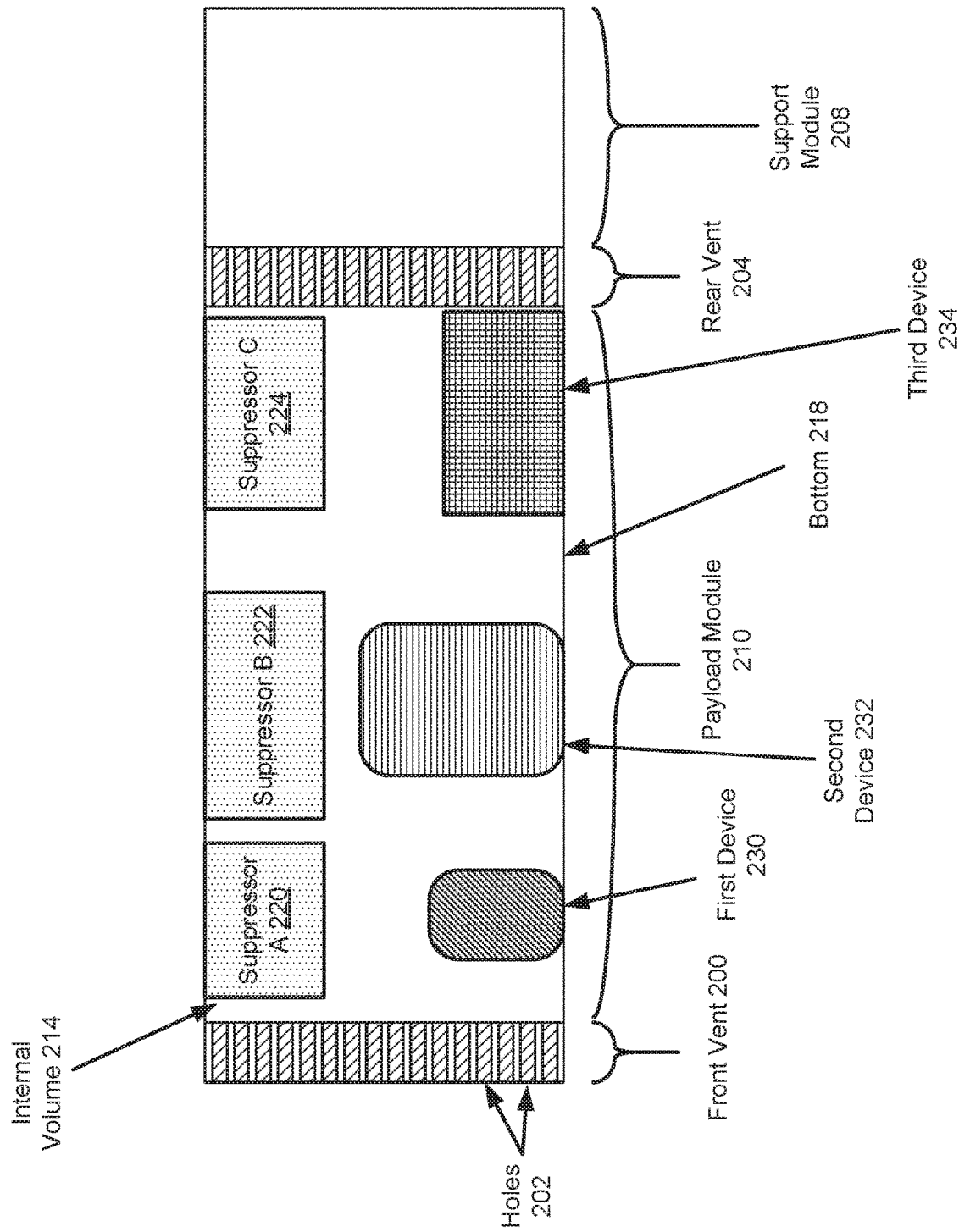
FIG. 2.4

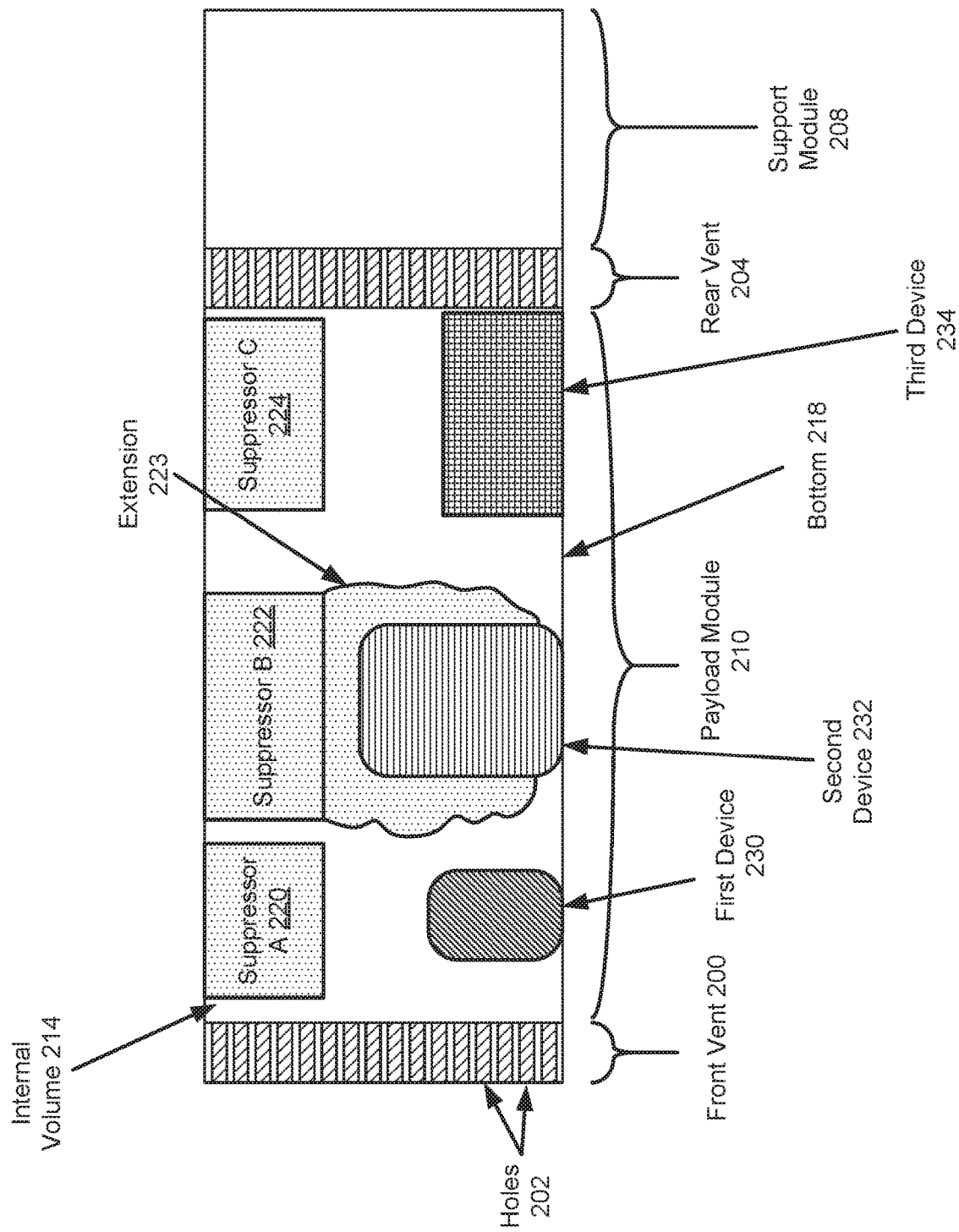
FIG. 2.5

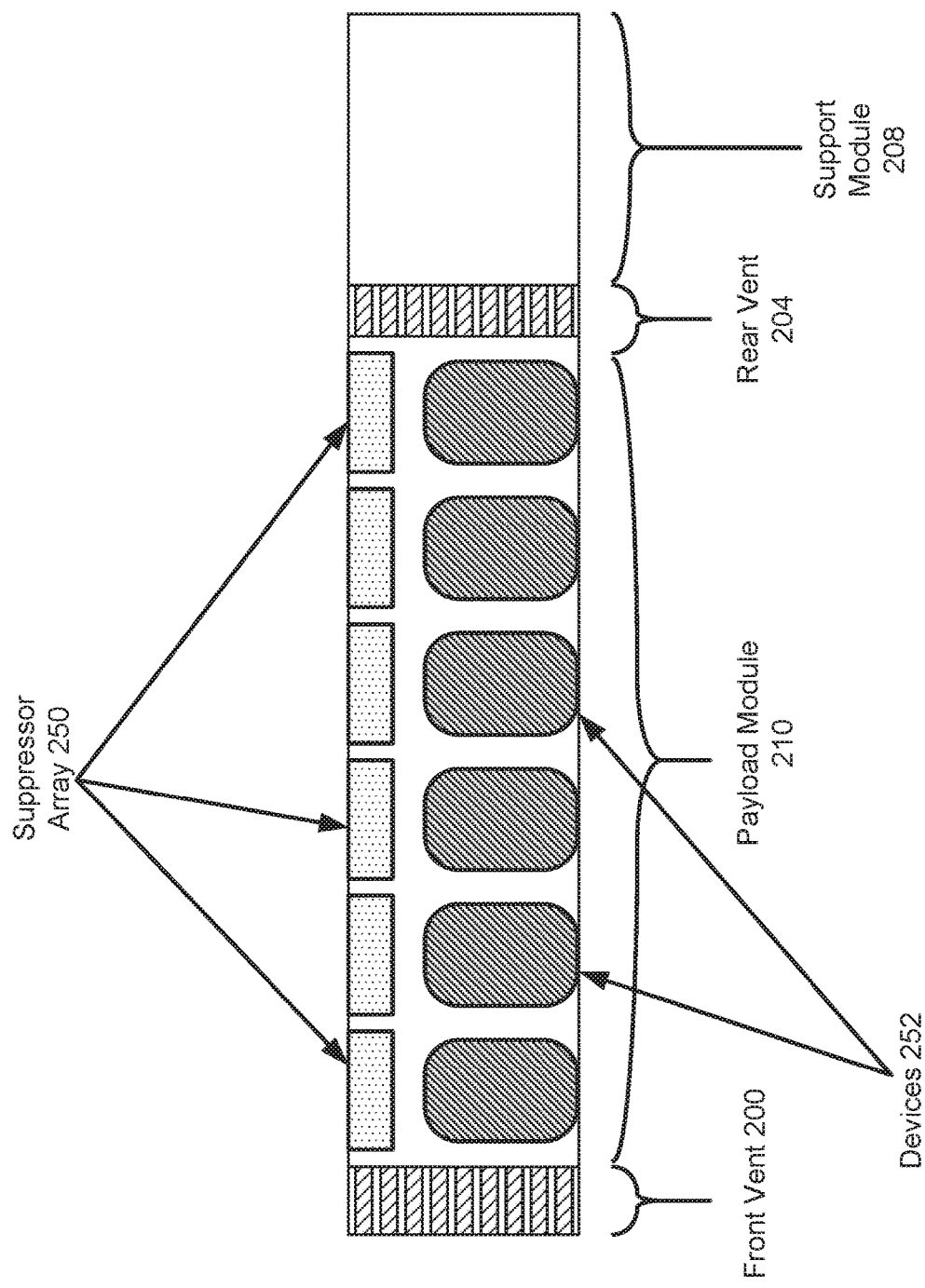
FIG. 2.6

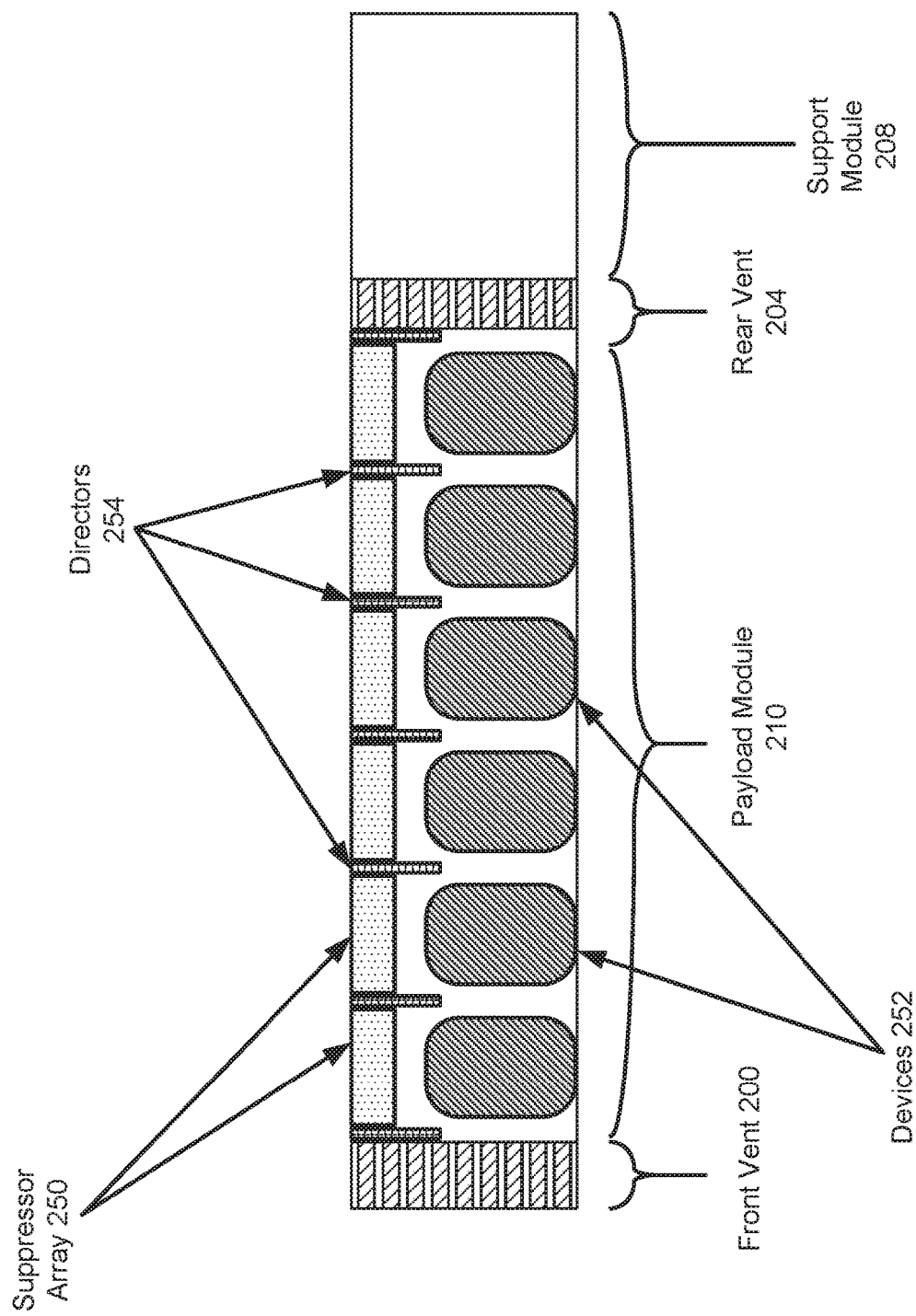
FIG. 2.7

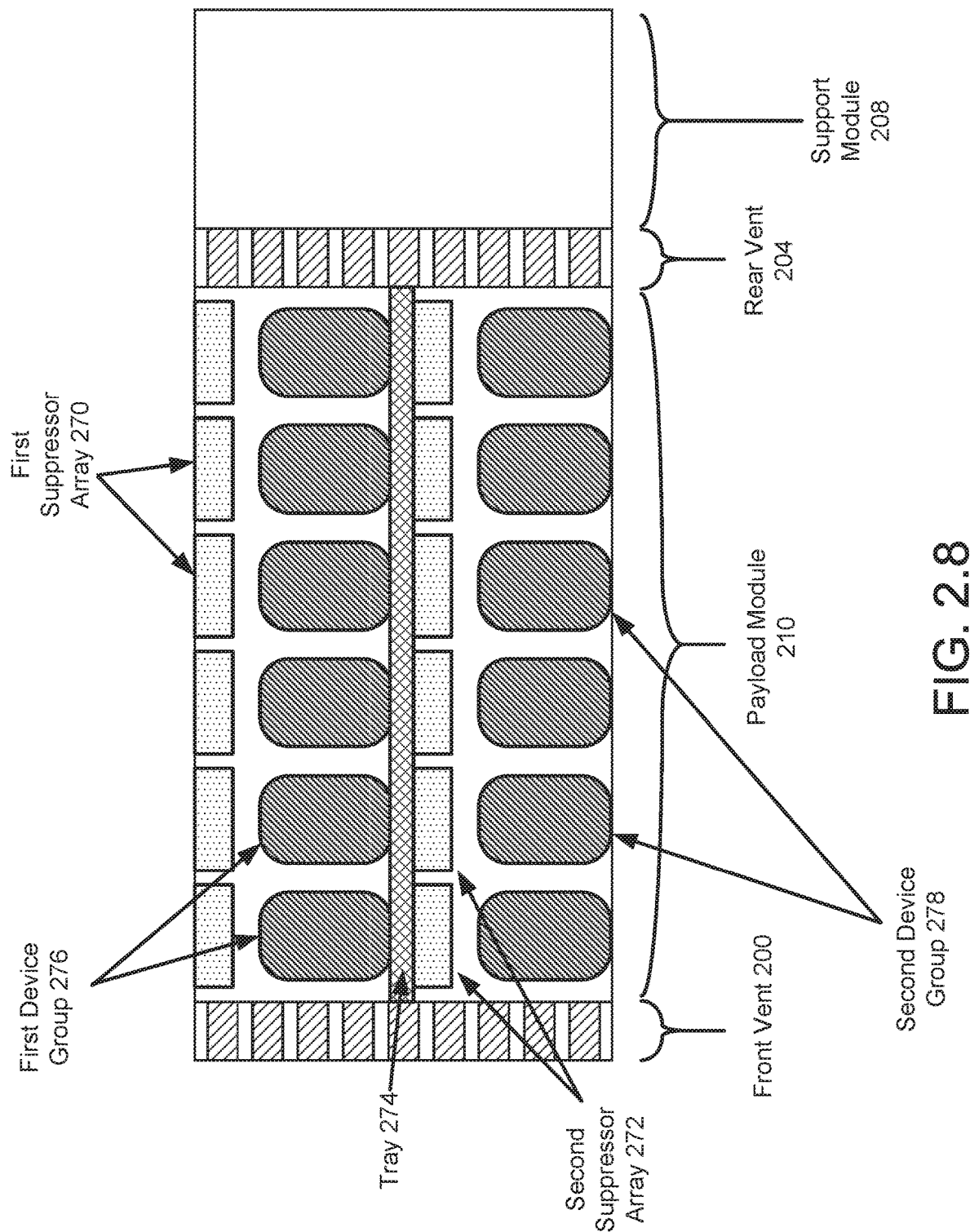
FIG. 2.8

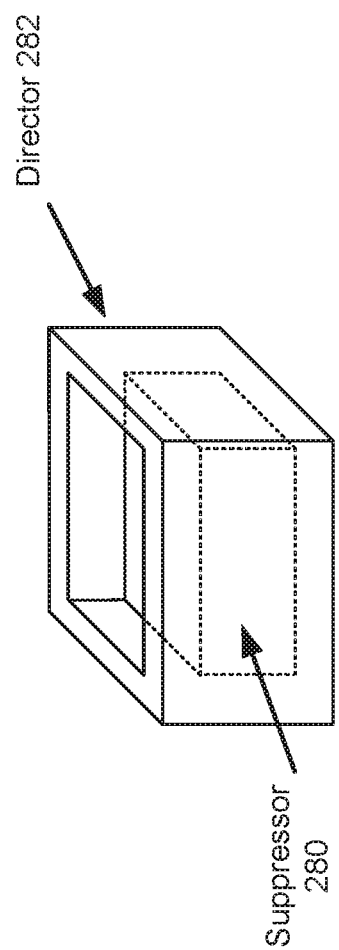
FIG. 2.9

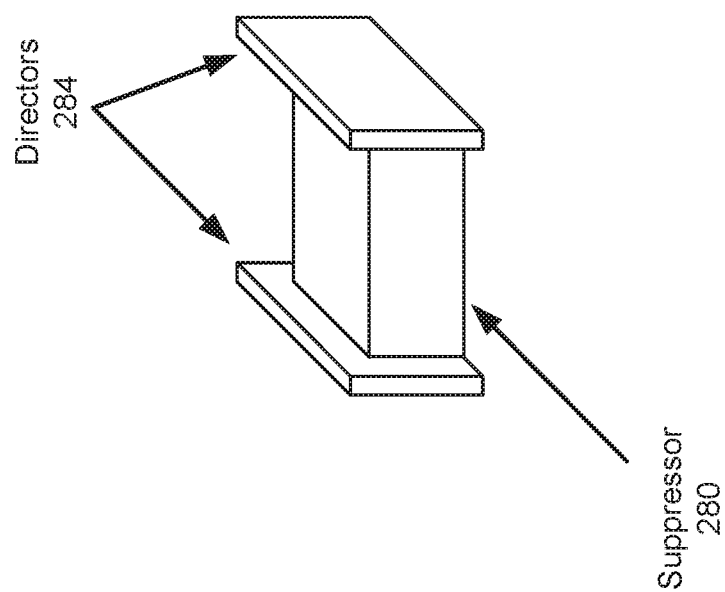
FIG. 2.10

SYSTEM AND METHOD FOR MANAGING THERMAL STATES OF DEVICES

BACKGROUND

A high density environment may include devices that are tightly packed together. In other words, the devices may be physically close to each other. Such an environment may present numerous challenges relating to thermal management, mechanical positioning and orienting of devices, and electrical concerns related to power and operation of such devices.

SUMMARY

In one aspect, a data processing device in accordance with one or more embodiments of the invention includes an internal volume for housing devices and a suppressor adapted to provide thermal management services to a device of the devices.

In one aspect, a method for providing thermal management services in accordance with one or more embodiments of the invention includes monitoring, by a suppressor, a thermal state of a device disposed in an internal volume of a data processing device; making a determination, by the suppressor, that the thermal state is a thermally compromised state; and modifying a shape of the suppressor to thermally manage the device in response to the determination.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cut-view diagram of the data processing device of FIG. 2.1 in accordance with one or more embodiments of the invention.

FIG. 2.3 shows a first cross section diagram of the data processing device of FIG. 2.1 in accordance with one or more embodiments of the invention.

FIG. 2.4 shows a second cross section diagram of the data processing device of FIG. 2.1 in accordance with one or more embodiments of the invention.

FIG. 2.5 shows a third cross section diagram of the data processing device of FIG. 2.1 in accordance with one or more embodiments of the invention.

FIG. 2.6 shows a fourth cross section diagram of the data processing device of FIG. 2.1 in accordance with one or more embodiments of the invention.

FIG. 2.7 shows a fifth cross section diagram of the data processing device of FIG. 2.1 in accordance with one or more embodiments of the invention.

FIG. 2.8 shows a sixth cross section diagram of the data processing device of FIG. 2.1 in accordance with one or more embodiments of the invention.

FIG. 2.9 shows a first diagram of a director in accordance with one or more embodiments of the invention.

FIG. 2.10 shows a second diagram of a second director in accordance with one or more embodiments of the invention.

DETAILED DESCRIPTION

Figure 3:
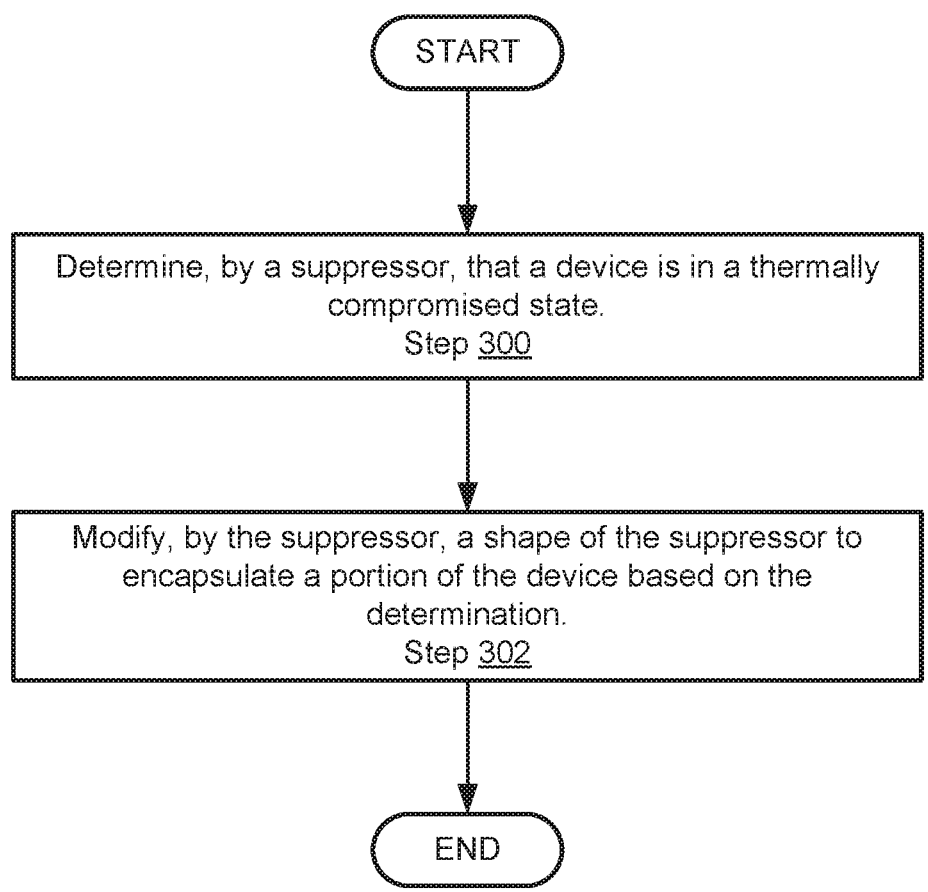
FIG. 3 shows a flowchart of a method of managing a thermal state of an electromagnetic interference emitting device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference generated by devices and the thermal state of devices in a high-density environment. Specifically, embodiments of the invention may provide a system that manages electromagnetic interference at a data processing device level and the thermal state of devices at a device level. By doing so, embodiments of the invention may facilitate the inclusion of devices in a high-density environment while mitigating the impact of electromagnetic interference generated by the devices and/or the potential thermal compromised states of such devices.

In one or more embodiments of the invention, a data processing device includes an internal volume for housing any number of devices. The data processing devices may electromagnetically isolate the devices from the ambient environment proximate to the data processing device by at least 90 decibels (or another suitable level). The data processing devices may also facilitate the insertion, removal, and/or modification of devices while maintaining the electromagnetic isolation of the aforementioned devices from the ambient environment.

In one or more embodiments of the invention, the data processing device provides thermal management services to the devices. The thermal management services may mitigate the risk of any of the devices entering a thermally compromised state. A thermally compromised state may be a thermal state in which the amount of thermal energy generated by a device exceeds an amount that may be managed via gas flows (or other methods for removing thermal energy from a device implemented by a data processing device). For example, a device may enter a thermally compromised state when all, or a portion, of the device begins to combust or otherwise generate more thermal energy than is designed to generate during normal operation. To provide the thermal management services, the data processing device may include any number of suppressors that, when activated, encapsulate all, or a portion, of a corresponding device. By doing so, the device may be thermally isolated from other devices and/or be provided with other benefits that may mitigate the impact of the thermally compromised state of the device.

When a device is isolated from other devices via a suppressor, the suppressor may, for example, prevent oxygen or other materials from reaching the device that could otherwise cause the device to maintain its thermally compromised state. Further, by isolating the device, the device may be prevented from causing other devices from entering a thermally compromised state by reducing the flow of heat from the device to other devices.

FIG. 1.1 shows an example system in accordance with one or more embodiments of the invention. The system may include a frame (100) and any number of data processing devices (102). The components of the example system may provide electromagnetic interference management services and/or thermal management services for devices disposed within the data processing devices (102). By doing so, devices that emit electromagnetic interference may be utilized in a high-density computing environment without negatively impacting the high-density computing environment while mitigating the thermal risk (e.g., fire) associated with such devices.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space. The system illustrated in FIG. 1.1 also manages thermal energy generated by the one or more electromagnetic interference emitting devices by (iii) monitoring the thermal states of the devices and (iv) taking action to manage the thermal energy when the thermal states of one or more devices becomes thermally compromised (e.g., starts generating too much thermal energy due to, for example, failure of a power source of a device).

To manage electromagnetic interference, the system of FIG. 1.1 may reduce the strength of the electromagnetic interference when propagating from inside of a portion of the data processing devices (102) to an ambient environment around the data processing devices (102) and/or other locations by at least 90 decibels or another suitable level of suppression. For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

The system of FIG. 1.1 may also automatically restrict propagation of thermal energy and/or reduce the ability of the devices to generate thermal energy to thermally manage the devices. For example, the system of FIG. 1.1 may include one or more suppressors. The one or more suppressors may be adapted to automatically isolate (totally or partially) one or more devices when all, or a portion, of the one or more devices enters a thermally compromised state. By doing so, the aforementioned thermally compromised device may be physically isolated which may reduce the likelihood of other devices from being impacted (e.g., being exposed to thermal energy generated by the thermally compromised device) by the thermally compromised state of the isolated device.

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For details regarding computing devices, refer to FIG. 4.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices (and/or other types of devices) within the data processing device. For example, an internal volume of the chassis may be a rectangular void capable of housing one or more electromagnetic interference emitting devices (and/or other types of devices).

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal regions may be formed in a manner that filters electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels or another suitable level of attenuation) when propagating from within the data processing devices (102) into the ambient environment surrounding the respective data processing devices (102).

To provide thermal management services to the computing devices, the electromagnetic interference emitting devices, and/or or other types of devices, the data processing devices (102) may include suppressors proximate to the aforementioned devices. Suppressors may be physical devices that respond to the generation of thermal energy by the devices. The suppressors, when responding to the generation of thermal energy by the devices, may change their shape to (i) contain the generated thermal energy, (ii) limit gas access to the devices, and/or (iii) isolate the devices from other devices disposed within a data processing device. By doing so, the thermal state (i.e., temperature) of the aforementioned devices may be regulated so as not to impact the operation of other devices disposed within the data processing devices. The gas may be air or another type/combination of gasses obtained from any source.

Additionally, the data processing devices may include one or more vents that enable gas from a first side of a data processing device to flow into the data processing device, through the data processing device, and out of a second side of the data processing device. The gas, flowing through the data processing device, may be at a different temperature than the computing devices, electromagnetic interference emitting devices, and/or other types of devices. Consequently, thermal exchange between the flow of gas and the aforementioned devices may occur resulting in the temperature of the aforementioned devices changing. By doing so, heat generated by the aforementioned devices may be expelled from the devices thereby further regulating the temperature (i.e., the thermal state) of the aforementioned devices to manage their respective thermal states.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 1.2-2.10.

As discussed above, data processing devices (102) may house electromagnetic interference emitting devices. When so housed, the electromagnetic interference emitting devices may operate thereby generating electromagnetic interference. At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services as well as thermal management services to devices disposed with the data processing devices.

As discussed above, a system in accordance with one or more embodiments of the invention may include one or more data processing devices. FIGS. 2.1-2.10 show diagrams of data processing devices in accordance with embodiments of the invention. FIGS. 2.1-2.10 show diagrams of the second data processing device (106) of FIG. 1.1. However, the other data processing devices of FIG. 1.1 may be similar to that illustrated in FIGS. 2.1-2.10.

FIG. 2.1 shows a diagram of the second data processing device (106) in accordance with one or more embodiments of the invention. As discussed above, the second data processing device (106) may provide electromagnetic interference management services and/or thermal management services for electromagnetic interference emitting devices disposed within the second data processing device (106). To do so, the second data processing device (106) may include a front vent (200), a rear vent (2.04), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200). For additional details regarding the internal volume, refer to FIG. 2.2.

In one or more embodiments of the invention, the front vent (200) is a rectangular structure formed with holes (202) (or other structures that enable gasses to flow through the front vent (200)) that enables gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause cool gas to flow into the second data processing device (106) via the front vent (200) and exhaust the cool gas (which may be at a higher temperature after exchanging heat as the gas traverses the second data processing device (106)) by flowing out a second side of the second data processing device (106) (e.g., out of the support module (208)). Alternatively, the second data processing device (106) may cause a reverse gas flow, of that discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The payload module (210) may be a physical device for (i) housing electromagnetic interference devices, (ii) limiting propagation of electromagnetic interference from internal volumes of the second data processing device (106) to the ambient environment surrounding the second data processing device (106), and/or (iii) thermally regulating devices disposed within the payload module (210). For additional details regarding the payload module (210), refer to FIGS. 2.2-2.10.

The support module (208) may be a physical device for housing devices that provide services to devices disposed within the payload module (210). For example, the support module (208) may house one or more power supplies, gas flow control devices, communications devices, and/or computing devices. The aforementioned devices may provide corresponding services to devices disposed in other portions of the second data processing device (106) and/or devices located in other locations (i.e., external to the second data processing device (106).

The one or more power supplies may supply power to other devices. For example, the power supplies may provide power to electromagnetic interference devices disposed within the payload module, other types of devices (e.g., computing device) disposed within the payload module, and/or devices located in other areas of the second data processing device.

The one or more power gas flow control components may provide thermal management services to other devices. For example, the gas flow control components may regulate the flow of gasses through the second data processing device. The gas flow control components may include fans (or other types of active flow control devices), gas flow monitoring sensors, and/or other types of components to manage gas flow.

The one or more power communication devices may provide communication services to other devices. For example, the communication devices may manage network interfaces that enable the electromagnetic interference emitting devices disposed within the payload module (210) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference.

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents (e.g., 200, 204), or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIG. 3. For additional details regarding computing devices, refer to FIG. 4.

To further clarify aspects of embodiments of the invention, a cut-view diagram of the second data processing device (106) in accordance with one or more embodiments of the invention is shown in FIG. 2.2. In FIG. 2.2, the second data processing device (106) has been cut along the X-Y plane illustrated in FIG. 2.1 and a portion, defined by the X-Y plane, has been removed to expose portions of the internal structure of the second data processing device (106).

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth size, by the front vent (200) and the rear vent (204). The front vent (200) and the rear vent (204) may be on opposite sides of the internal volume (214). By doing so, the front vent (200) and the rear vent (204) may define an gas flow path through the payload module (210). For example, gasses may be able to flow between the two vents through the internal volume (214). As discussed above, to control such gas flows, fans or other gas flow control devices may be disposed in the support module (208). Gas flow control devices may be disposed in other locations (e.g., in the payload module, on an exterior of the front vent (200), etc.) to control the flow of gasses through the payload module (210) without departing from the invention.

While the payload module (210) and internal volume (214) have been illustrated as having a rectangular shape, the aforementioned components may be of different types of shapes without departing from the invention. Further, while the front vent (200) and the rear vent (204) have been described as being disposed on opposite sides of the internal volume (214), the vents may be located at other locations to define gas flow paths of different shapes without departing from the invention. For example, the rear vent (204) may be aligned with the bottom (218), the top door (212), or the sides (e.g., 216) to define an gas flow path having a turn (rather than being a straight line).

The gas flow path through the internal volume (214) may be of any shape without departing from the invention. The internal volume (214) may include any number of gas flow paths (i.e., the internal volume (214) may be bounded by additional vents other than the front vent (200) and the rear vent (204)).

As discussed above, the second data processing device may provide thermal management services to devices disposed within the internal volume (214) by controlling the flow of gas within the internal volume (214). However, controlling the flow of gas within the internal volume (214) may not always be capable of managing the thermal state of devices disposed within the internal volume.

For example, a device disposed within the internal volume may include a component (e.g., a battery) that when entering a failure state (e.g., a thermally compromised state) produces large amounts of thermal energy (e.g., due to chemical/mechanical/other types of reactions such as combustion) beyond that which can be mitigated using gas flow control. In such a scenario, the large amount of thermal energy generated by the device may negatively impact the operation of the device and/or other devices within the second data processing device and/or other devices.

In one or more embodiments of the invention, the second data processing device includes one or more suppressors for managing thermal energy generated by devices that have entered a thermally compromised state. A suppressor may be a physical device that provides thermal management services for devices that have been thermally compromised. For additional details regarding suppressors and/or thermal management of thermally compromised devices, refer to FIGS. 2.3-3.

To further clarify aspect of embodiments of the invention, cross section diagrams taken along the X-Y plane illustrated in FIG. 2.1 are shown in FIGS. 2.3-2.10. Each of FIGS. 2.3-2.10 illustrate different internal configurations of the second data processing device in accordance with embodiments of the invention.

FIG. 2.3 shows a first cross section of the second data processing device, taken along the X-Y plane illustrated in FIG. 2.1, in accordance with one or more embodiments of the invention. As discussed above, the second data processing device may include any number of suppressors (220, 222, 224).

In one or more embodiments of the invention, the suppressors (220, 222, 224) are adapted to provide thermal management services for corresponding suppression regions (226, 227, 228). The suppressors (220, 222, 224) may be adapted to provide thermal management services when a thermal state of the device for which the respective suppressor is providing thermal management services enters into a thermally compromised state. A thermally compromised state may be a thermal state in which a device is or is likely to generate more thermal energy than can be managed via use of gas flow, discussed above. For example, if a device ignites the device may enter a thermally compromised state.

The suppressors (220, 222, 224) may be physical devices. The physical devices may include a material that is adapted to expand when exposed to a predetermined quantity of thermal energy. The predetermined quantity of thermal energy may correspond to an amount of thermal energy released by the device for which the respective suppressor provides thermal management services.

For example, the suppressors may include a thermally activated polymer and/or retardant agent. When exposed to the predetermined quantity of thermal energy, the thermally activated polymer may expand in size. By doing so, the respective suppressors may partially or totally encapsulate a corresponding device(s) for which the suppressor is providing thermal management services. The suppressors may be activated via other methods without departing from the invention. For example, the suppressors may be activated by a thermal manager, or other device, that manages the thermal state of the second data processing device.

When partially and/or totally encapsulated by the suppressor, the suppressor may (i) limit gas access to the encapsulated device and/or (ii) physically isolate the device from other devices disposed within the internal volume (214) of the second data processing device. By doing so, the suppressor may reduce the amount of thermal energy generated by the device by limiting gas access to the device and/or contain thermal energy generated by the device within the corresponding suppression region (or otherwise prevent thermal energy generated by the device from negatively impacting other devices disposed within the internal volume (214)).

The retardant agent may be a material embedded within the suppressor (e.g., the suppressors may be formed of a composite material including a heat activated component and a chemical reaction retardant component). The combustion retardant agent may be any type of material that retards one or more types of chemical reactions. For example, the retardant agent may reduce the likelihood of combustion occurring or otherwise interrupt existing occurrences of chemical reactions that utilize oxygen and/or generate thermal energy as a byproduct of the chemical reactions.

When providing thermal management services, the suppressors (220, 222, 224) may provide thermal management services for corresponding suppression regions. A suppression region (e.g., 226, 227, 228) may be a physical region for which a corresponding suppressor provides thermal management services. For example, suppressor A (2.20) may be adapted to provide thermal management services to suppression region A (226).

To do so, the shape and/or composition of suppressor A (220) may preferentially direct a change in the shape of suppressor A (220) to cause the changed shape of suppressor A (220) to extend into and/or throughout suppression region A (226). As noted above, the change of the shape of suppressor A (220) may occur in response to device disposed within suppression region A (226) generating a predetermined amount of thermal energy. For example, a device disposed in suppression region A (226) may generate the predetermined amount of thermal energy when a battery of the device fails. Failure of the battery of the device may cause the battery and/or other portions of the device to ignite. The ignition of the battery and/or other portions the device may generate at least the predetermined amount of thermal energy required to activate suppressor A (220). For additional details regarding the shape change functionality of suppressors, refer to FIGS. 2.4-2.5.

In one or more embodiments of the invention, different suppressors disposed in internal volume (214) are adapted to provide thermal management services for corresponding suppression regions of different sizes. For example, the shape, size, and/or composition of the respective suppressors may impact the corresponding size of the suppression regions for which the suppressors may provide thermal management services.

With respect to the example internal configuration of the second data processing device as illustrated in FIG. 2.3, suppressor A (220) may be of a smaller size than suppressor B (222). Consequently, suppressor A (220) may only provide thermal management services for suppression region A (226) which is smaller in size and suppression region B (227) for which suppressor B (222) provides thermal management services.

A data processing device in accordance with embodiments of the invention may include any number of suppressors. Each of the suppressors may be of similar or different sizes, shapes, and/or compositions (e.g., a homogeneous or heterogeneous group of suppressors). The size, shape, and/or composition of each of the suppressors may be adapted to provide thermal management services for corresponding suppression regions of similar and/or different sizes.

To further clarify the use of suppressors with devices and the shape change functionality of the suppressors, FIGS. 2.4-2.5 show diagrams that illustrate an example of use of suppressors within the second data processing device.

FIG. 2.4 shows a second cross section of the second data processing device, taken along the X-Y plane illustrated in FIG. 2.1, in accordance with one or more embodiments of the invention. The internal configuration (e.g., the contents of the internal volume (214)) of the second data processing device is similar to that as illustrated in FIG. 2.3 but also includes devices (230, 232, 234) disposed within the internal volume (214).

As configured in FIG. 2.4, suppressor A (220) may provide thermal management services to first device (230), suppressor B (222) may provide thermal management services to the second device (232), and suppressor C (224) may provide thermal management services for the third device (234). The first device (230) may be a personal electronic device such as, for example, a cell phone. The second device (232) may be a personal electronic device such as, for example, a tablet computer. The third device (234) may be a computing device such as, for example, a laptop computer. The aforementioned devices may be other types of devices without departing from the invention. For example, any of the devices may be a component of the second data processing device such as, for example, a communication system, high-power supply system, gas flow control component, or any other type of component that may be utilized by the second data processing device.

To provide thermal management services, each of the suppressors may be disposed along heat flow paths corresponding to each of the devices. For example, suppressor A (220) may be disposed above the first device (230). Consequently, thermal energy generated by the first device (230) may be directed upwards towards suppressor A (220). The other suppressors may be disposed along heat flow paths corresponding to the other devices for which the other suppressors provide thermal management services.

Any of the devices (e.g., 230, 232, 234) may at any time enter a thermally compromised state. For example, due to the failure of other components such as a battery, power supply, or other component any of the devices may begin generating thermal energy at a rate for which a flow of gas through the internal volume (214) is unable to manage the generated thermal energy. Consequently, if left unchecked, the generated thermal energy may impact the operation of the device itself, other devices disposed within the internal volume, other devices disposed within other portions of the second data processing device, and/or other devices disposed outside of the second data processing device.

To mitigate such potential occurrences, the suppressors (220, 222, 224) may provide thermal management services under such conditions. Consider an example scenario in which the second device (232) begins to generate thermal energy at a rate greater and for which a gas flow through the internal volume (214) is able to manage the generated thermal energy.

In such a scenario, suppressor B (222) may detect that the second device (232) is entered a thermally compromised state. Suppressor B (222) may do so by detecting the thermal energy generated by the second device (232) due to suppressor B (222) being disposed in a heat flow path corresponding to the second device (232).

Upon detection that the second device (232) is entered a thermally compromised state, suppressor B (222) may activate. For example, a thermally activated component of suppressor B (222) may respond to the thermal energy.

The response may be to change the shape of suppressor B (222). FIG. 2.5 shows a third cross section of the second data processing device, taken along the X-Y plane illustrated in FIG. 2.1, in accordance with one or more embodiments of the invention. In FIG. 2.5, suppressor B (222) has been activated.

When activated, the shape of suppressor B (222) changed to include an extension (223). The extension (223) was generated by the activation of the thermally activated component of suppressor B (222). For example, the thermally activated component of suppressor B (222) may expand in size when activated.

In one or more embodiments of the invention, the expansion in size when activated of suppressor B (222) is anisotropic. For example, the expansion in size of suppressor B (222) may be preferentially directed towards a suppression region corresponding to suppressor B (222). In one or more embodiments of the invention, directors may be used to preferentially direct the expansion of the suppressors. For additional details regarding directors, refer to FIGS. 2.7, 2.9, and 2.10.

By virtue of being disposed within the suppression region, the second device (232) may be impacted by the expansion of suppressor B (222). Specifically, the extension (223) of the original shape of suppressor B (222) may totally or partially encapsulate the second device (232) within the extension (223). Consequently, after activation of suppressor B (222), the second device (232) may be partially or totally encapsulated in suppressor B (222). The second device (232) may be partially or totally encapsulated by suppressor B (222) by portions of suppressor B (222) surrounding portions of second device (232).

While the extension (223) is illustrated in FIG. 2.5 as only partially encapsulating the second device (232), extensions (223) in accordance with one or more embodiments of the invention may partially encapsulate devices to greater (up to total encapsulation) or lesser degrees. Further, different extensions may encapsulate different amounts of corresponding devices. For example, some extensions may totally encapsulate corresponding devices while other extensions may only partially encapsulate corresponding devices. Thus, different suppressors may provide different levels of encapsulation functionality for thermally managing corresponding devices. The amount of capsulation may vary depending on, for example, the type of corresponding device. Because different devices may have different shapes, sizes, and other characteristics, the encapsulation level for different devices may intentionally vary to match the level of encapsulation to the corresponding device.

Additionally, while FIGS. 2.4-2.5 have been illustrated as including suppressors of varying sizes, embodiments of the invention include other arrangements of suppressors. FIGS. 2.6-2.8 show diagrams of the second data processing device including different internal configurations in accordance with one or more embodiments of the invention.

As discussed above, the second data processing device may have an internal configuration different from that illustrated in FIGS. 2.4-2.5 without departing from the invention.

FIG. 2.6 shows a fourth cross section of the second data processing device, taken along the X-Y plane illustrated in FIG. 2.1, in accordance with one or more embodiments of the invention. In FIG. 2.6, the internal configuration (e.g., the contents of the internal volume (214)) of the second data processing device includes a suppressor array (250).

The suppressor array (250) may include any number of identical suppressors. Each of the identical suppressors may have a similar shape, size, and composition. Each of the identical suppressors may provide thermal management services for corresponding devices (252).

The devices (252) may be electromagnetic interference emitting devices. For example, the electromagnetic interference emitting devices may be personal electronic devices such as cell phones. As such, each of the devices (252) may include a component such as a battery that is subject to catastrophic failure. In the catastrophic failure, the component may generate large amounts of thermal energy due to combustion.

The suppressor array (250) may be adapted to: (i) detect catastrophic failures in the devices (252), (ii) changes shape of a corresponding suppressor of the suppressor array (250) to totally or partially encapsulate the device suffering a catastrophic failure, and (iii) isolate the device suffering the catastrophic failure from the other devices (252). By doing so, a catastrophic failure of one or more of the devices (252) may be isolated from the other devices (252). Consequently, a catastrophic failure that would otherwise impair all, or a portion, of the devices (252) may be isolated to only impair the device suffering the catastrophic failure.

As discussed above, the second data processing device may include directors. FIG. 2.7 shows a fifth cross section of the second data processing device, taken along the X-Y plane illustrated in FIG. 2.1, in accordance with one or more embodiments of the invention. In FIG. 2.7, the internal configuration (e.g., the contents of the internal volume (214)) of the second data processing device is similar to that of FIG. 2.6 but includes directors (254).

The directors (254) may be physical devices that may assist the suppressors of the suppressor array (250) to provide thermal management services. For example, the directors (254) may preferentially direct thermal energy from the devices (252) to corresponding suppressors of the suppressor array (250).

Additionally, the directors (254) may preferentially direct expansion of activated suppressors of the suppressor array (250) towards corresponding devices (252). For example, the directors (254) may limit the expansion of the suppressors of the suppressor array (250) in directions other than the corresponding devices (252).

In one or more embodiments of the invention, the directors (254) are physical devices disposed adjacent to the suppressors of the suppressor array (250). The directors (254) may be structural members for directing gas flows and/or the expansion of the suppressors of the suppressor array (250). For example, the directors (254) may be tubular members aligned towards corresponding devices. Suppressors of the suppressor array (250) may be disposed within the directors (254). For additional details regarding the directors (254) and suppressors disposed within the directors (254), refer to FIGS. 2.9-2.10.

While the devices (252) and the suppressor array (250) are illustrated as including a specific number of elements, the devices (252) and the suppressor array (250) may include any number of elements without departing from the invention. Additionally, while the devices (252) are illustrated as being a single row of devices, multiple rows of devices (252) may be disposed within the internal volume of the second data processing device without departing from the invention.

As discussed above, the second data processing device may include many different types of arrangement of devices disposed within the second data processing device. FIG. 2.8 shows a sixth cross section diagram of the second data processing device, taken along the X-Y plane illustrated in FIG. 2.1, in accordance with one or more embodiments of the invention. In FIG. 2.8, the internal configuration (e.g., the contents of the internal volume (214)) of the second data processing device is similar to that of FIG. 2.6 but includes multiple groups of devices (e.g., 276, 278) and multiple suppressor arrays (270, 272).

In FIG. 2.8, a first device group (276) is disposed on top of a tray (274). The tray (274) may be a physical structure such as a plane of metal that divides the internal volume into an upper volume and a lower volume.

A first device group (276) may be disposed in the upper volume ad a corresponding first suppressor array (270), that provides thermal management services to the first device group (276), may also be disposed in the upper volume. A second device group (278) may be disposed in the lower volume and a second suppressor array (272) may also be disposed in the lower volume to provide thermal management services to the second device group (278).

While the second data processing device is illustrated in FIG. 2.8 as being divided into two volumes separated by a tray (274), a data processing device in accordance with one or more embodiments of the invention may include an internal volume divided into any number of volumes separated by any number of trays (e.g., 274) or other physical structures without departing from the invention. By doing so, the internal volume may be used more efficiently by facilitating the disposition of larger numbers of devices within the internal volume.

As discussed above, directors may be used in conjunction with suppressors in some embodiments of the invention. To further clarify the use of directors and suppressors, example diagrams of such arrangements are illustrated in FIGS. 2.9-2.10.

FIG. 2.9 shows a diagram of a suppressor (280) and a director (282) in accordance with one or more embodiments of the invention. As discussed above, the suppressor (280) may be adapted to provide thermal management services. When providing such services, the director (282) may monitor the thermal state of a corresponding device for which thermal management services are to be provided and take action in response to determining a change in the thermal state of the corresponding device. The action may be, for example, to expand in size to partially or totally encapsulate the corresponding device.

To facilitate detection of changes in thermal state of the corresponding device and/or facilitate preferential expansion towards the corresponding device, a director (282) may be utilized. As discussed above, the director (282) may be a physical structure that assists the suppressor (280).

The director (282) may be a physical device. The director (282) may be a tubular member. The tubular member may have a hollow internal cross section that corresponds to a cross-section of the suppressor (280). Consequently, the suppressor (280) may be able to be disposed within the director (282).

While the director (282) is illustrated in FIG. 2.9 as having a rectangular cross-section (e.g., a hollow square), the director (282) may have different cross-sections without departing from the invention. For example, the director (282) may have a hollow circular cross-section, a hollow rectangular cross-section, a hollow higher-order polygon cross-section, or any other type of cross-section that may facilitate the functionality of the director (282).

For example, in some embodiments of the invention, a director may not be the tubular member. FIG. 2.9 shows a diagram of the suppressor (280) and directors (284) in accordance with one or more embodiments of the invention. As seen from FIG. 2.10, the directors (284) may be a set of side-walls. Like the director (282) of FIG. 2.9, the directors (284) may assist the suppressor (280) in providing thermal management services to corresponding devices by directing gasses (e.g., heat flows) and expansion of the suppressor (280) when activated.

The directors (284) illustrated in FIG. 2.10 (and other directors discussed throughout this application) may include any suitable structural material to provide the functionality of the directors (284). For example, the directors (284) may include plastic, metal, ceramic, or any other material that may be used to provide the above noted functionality of the directors (284).

Thus, as illustrated in FIGS. 2.1-2.10, a data processing device in accordance with one or more embodiments of the invention include functionality to thermally manage devices disposed within the data processing device even when the thermal state of devices becomes compromised. To do so, the data processing devices may include one or more suppressors that provide thermal management services to corresponding devices. By doing so, thermal management services for devices may be provided on a device level rather than on a data processing device level.

To provide the above noted functionality of the suppressors, the suppressors may perform all, or a portion, of the method illustrated in FIG. 3.

FIG. 3 shows a flowchart of a method in accordance with one or more embodiments of the invention. The method depicted in FIG. 3 may be used to provide thermal management services in accordance with one or more embodiments of the invention. The method shown in FIG. 3 may be performed completely, or in part, by, for example, data processing devices (e.g, 102, FIG. 1.1). Other components of the system illustrated in FIG. 1.1 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, it is determined that the device is in a thermally compromised state. The determination may be made by a suppressor disposed in an internal volume of the data processing device. For example, the suppressor may monitor the thermal energy generated by the device. If the amount of thermal energy generated by the device exceeds a predetermined amount, the suppressor may determine that the device is in the thermally compromised state.

In one or more embodiments of the invention, the predetermined amount of thermal energy corresponds to an amount generated when a component of the device suffers a catastrophic failure. The catastrophic failure may be, for example the combustion of event. In one or more embodiments of the invention, the catastrophic failure is a failure of a battery of the device. The device may be, for example, an electromagnetic interference emitting device. The electromagnetic interference emitting device may be a personal electronic device such as, for example, the cell phone, tablet computer, laptop computer, a personal digital assistant, or another type of device. The aforementioned devices may generate electromagnetic interference in the form of electromagnetic radiation used by the aforementioned devices to communicate with other devices.

In step 302, the suppressor modifies its shape to encapsulate a portion of the device based on the determination.

In one or more embodiments of the invention, the suppressor modifies the shape by including a thermally activated component that expands in response to thermal energy exceeding the predetermined amount. For example, when a device suffers a catastrophic failure the device may generate thermal energy that is transmitted to the suppressor. The transmission may be through, for example, convective heat transport. The thermally activated component may expand in response to the convective heat transport.

In one or more embodiments of the invention, the portion of the device is all of the device.

In one or more embodiments of the invention, the portion of the device includes a component that is likely to suffer a catastrophic failure. For example, the component may be a battery. The component may be other types of components of the device without departing from the invention.

In one or more embodiments of the invention, encapsulating the device surrounds the portion of the device with the suppressor. For example, the suppressor may and isotopically expand towards the device. The expansion of the suppressor may surround the portion of the device.

Encapsulating the device may partially or totally isolate the device from other devices disposed within the data processing device. Encapsulating the device may partially or totally limit gas access to the device.

The method may end following step 302.

Thus, via the method illustrated in FIG. 3, a data processing device in accordance with one or more embodiments of the invention may thermally manage devices disposed within the data processing device on a device level (rather than on a data processing device level).

Figure 4:
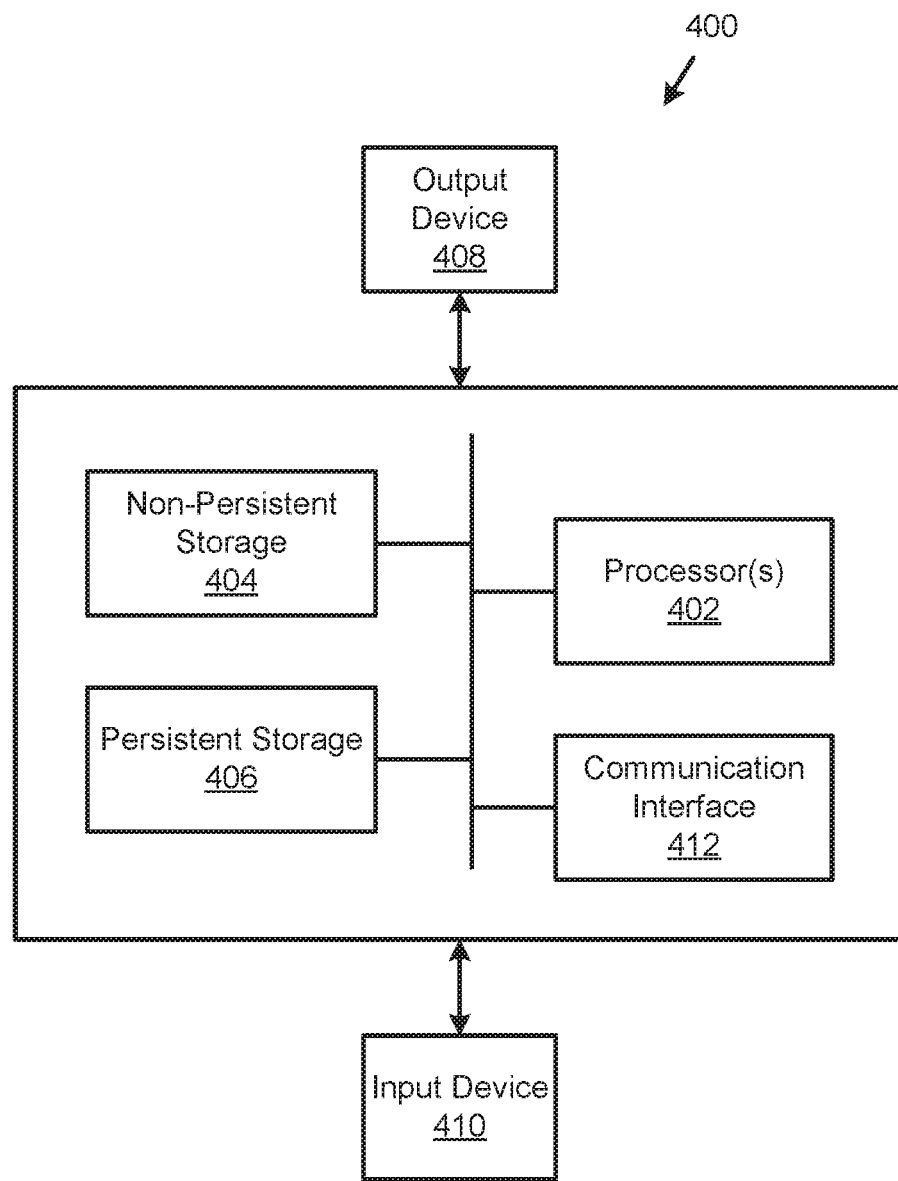
FIG. 4 shows a diagram of a computing device in accordance with one or more embodiments of the invention.

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide a method, system, and device for managing electromagnetic interference generated by devices and thermal states of the devices. A system in accordance with embodiments of the invention may manage electromagnetic interference at a data processing device level. That is, such a data processing device may include functionality to limit the propagation of electromagnetic interference from within data processing devices to an ambient environment surrounding the data processing device. By doing so, such data processing devices may be used in a high-density environment without negatively impacting the functionality of the high-density environment.

Additionally, embodiments of the invention may provide for thermal management of devices on a device level. For example, a data processing device in accordance with embodiments of the invention may include thermal energy-activated suppressors that each manage the thermal state of corresponding devices. By managing the thermal state of devices on a per-device level, embodiments of the invention may provide a data processing device that is able to utilize devices that are at a high level of risk for catastrophic failure while mitigating such risk.

Thus, embodiments of the invention may address the problem of use of volatile (e.g., high risk devices such as devices that utilize batteries) within a high-density environment. Specifically, embodiments of the invention may provide a data processing device that granularly manages thermal states of such devices.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A method for managing thermal states of devices disposed within a casing, the method comprising:
    disposing a thermally activated material on a first surface of the casing and above a device among the devices;
    exposing the thermally activated material to thermal energy generated by the device; and
    in response to the thermal energy generated by the device exceeding a predetermined quantity of thermal energy, causing the thermally activated material to expand and encapsulate the device.

2. The method of claim 1, wherein causing the thermally activated material to expand and encapsulate the device further comprises causing the thermally activated material to contain the thermal energy generated by the device within a predetermined suppression region of the thermally activated material.

3. The method of claim 1, wherein causing the thermally activated material to expand and encapsulate the device further comprises causing the thermally activated material to limit gas access to the device.

4. The method of claim 1, wherein disposing the thermally activated material above the device further comprises overlapping the first surface occupied by the thermally activated material with a second surface of the casing occupied by the device.

5. The method of claim 4, wherein the first surface occupied by the thermally activated material is larger than the second surface occupied by the device.

6. The method of claim 1, wherein the thermally activated material encapsulates a portion of the device.

7. The method of claim 1, wherein the thermally activated material encapsulates an entirety of the device.

8. The method of claim 1, wherein the thermally activated material is a thermally activated polymer.

9. The method of claim 1, wherein the thermally activated material is a thermally activated retardant agent.

10. The method of claim 1, wherein the thermally activated material is a thermally activated retardant agent encapsulated within a thermally activated polymer.

11. The method of claim 1,
    wherein disposing the thermally activated material on the first surface of the casing and above the device among the devices comprises disposing a separate and distinct portion of the thermally activated material on the first surface of the casing and above the device;
    the method further comprising:
        disposing a separate and distinct second portion of the thermally activated material on the first surface of the casing above a second device of the devices.

* * * * *